United States Patent [19]

Micic et al.

[11] Patent Number: 4,905,289

[45] Date of Patent: Feb. 27, 1990

[54] APPARATUS FOR THE DIGITAL STORAGE OF AUDIO SIGNALS EMPLOYING READ ONLY MEMORIES

[75] Inventors: Ljubomir Micic, Freiburg; Thomas Fischer, Umkirsch, both of Fed. Rep. of Germany

[73] Assignee: Deutsche ITT Industries GmbH, Freiburg, Fed. Rep. of Germany

[21] Appl. No.: 315,248

[22] Filed: Feb. 27, 1989

Related U.S. Application Data

[63] Continuation of Ser. No. 37,371, May 1, 1987, abandoned.

[30] Foreign Application Priority Data

May 15, 1986 [EP] European Pat. Off. ........ 86106577.9

[51] Int. Cl.4 .................................................. G10L 5/00
[52] U.S. Cl. ........................................... 381/51; 365/45
[58] Field of Search ................. 364/513.5; 381/51–53; 365/45

[56] References Cited

U.S. PATENT DOCUMENTS 4,163,120  7/1979  Baumwolspiner ................... 381/51
4,318,188  3/1982  Hoffmann ......................... 381/51 X
4,618,982  10/1986  Horvath ............................... 381/35
4,698,776  10/1987  Shibata ................................ 381/36

Primary Examiner—Emanuel S. Kemeny
Attorney, Agent, or Firm—Thomas L. Peterson

[57] ABSTRACT

A semiconductor read only memory (ROM) serves to store digitized audio signals in a redundancy free form. The output of the memory is coupled to the input of a data expander in the playback circuit. The memory may also store an algorithm which serves to control operation of the data expander before the signals are further processed via a digital-to-analog converter and where the output of the digital/analog converter is then coupled to the input of an analog amplifier and then to a loud speaker arrangement. In this manner, digitized audio signals can be operated on by either error correcting modules or data expansion modules, both of which modules may include microprocessors where the algorithms for control of the microprocessors are also stored within the read only memory. In this manner, all mechanical movements between the storage medium and the pick up devices, which are typical of the prior art, is eliminated as the main storage medium consists of a read only memory or a plurality of such devices.

5 Claims, 1 Drawing Sheet

APPARATUS FOR THE DIGITAL STORAGE OF AUDIO SIGNALS EMPLOYING READ ONLY MEMORIES

This is a continuation, of application Ser. No. 037,371 filed May 1, 1987 now abandoned.

BACKGROUND OF THE INVENTION

This invention relates to the digital storing of audio signals in general and more particularly to the storing of music or sound signals employing semiconductor read only memories.

Presently, in modern techniques, the so-called compact disc is employed. This disc stores audio signals in pulse code modulated form and enables one to store such signals, such as music or sound signals, using such devices in a reliable and consistent manner. Furthermore, a recent innovation employs 8 mm standard video recorders which are also suitable for storing pulse code modulated audio signals. In any event, these devices, employing such storage mediums such as compact discs or video recorders, require a movement between the storage medium and a correspondingly designed pick up head in order to retrieve the data stored on the disc or on the tape. These latest developments employ well-known principles which have been used for many years, namely that of utilizing a recording medium which is associated with a typical playback head and movement therebetween for scanning stored data.

Suffice it to say that while such devices have been greatly improved in operating characteristics and so on, they still present the difficult problem of depending upon movement between the recording media and the sampling head. Thus, such systems are associated with complicated mechanical playback devices which are associated with the recording medium and the playback devices.

In view of the above it would be desirable to eliminate the movement between a recording medium and a playback head in order to provide a consumer with a system which requires no movable parts.

Thus, it is an object of this invention to provide semiconductor read only memories (ROMS) as the storage medium for audio signals, such as music and sound signals It is a further object to employ such memories in conjunction with a playback device which does not employ any moving parts and hence requires no mechanical movement during the playback procedure.

BRIEF SUMMARY OF THE INVENTION

An apparatus for digital storage of audio signals to enable the playback of the signals as stored without the use of mechanically moving playback means comprising a read only memory having a plurality of storage locations, with a first plurality of locations adapted to store digitized signals each indicative of an audio signal and digital to analog converter means having an input coupled to the memory and operative to convert the stored signals to audio signals at an output.

BRIEF DESCRIPTIONS OF FIGURES

DETAILED DESCRIPTION OF INVENTION

Figure 1:
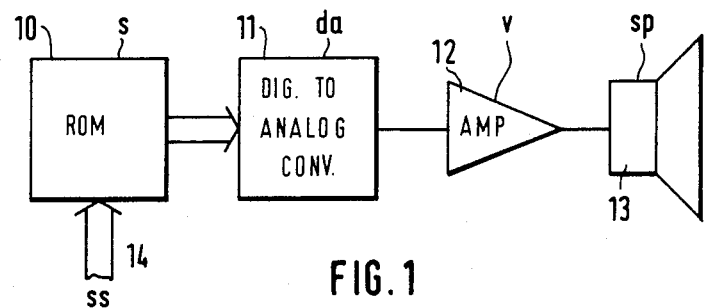
FIG. 1 is a schematic block diagram of a playback device including a memory according to this invention.

Referring to FIG. 1 there is shown a memory 10 which is a semiconductor read only memory (ROM) of the conventional kind and available through many sources. Depending on the storage capacity, the memory 10 may consist of an arrangement of several individual semiconductor chips but it is understood that a single chip of adequate size and memory capacity can be employed as well. The memory 10, as is known, conventionally has a plurality of storage locations, each one of which is adapted to store a digitized audio signal. This signal can be, for example, a pulse code modulated signal such as the type of signal stored on a compact disc. The memory 10 is associated with an input data bus 14 which receives digitized audio signals which are then placed is various memory positions, as is well known. The signals, as stored in the memory, are at least made partially free from redundancy in order to achieve the most optimal utilization of the available storage area in memory 10. Suitably, for example, this may be accomplished with the aid of adaptive differential pulse code modulation or one may employ a transform code system.

In such a Fourier transform code system those particular spectral lines would be suppressed as those lines which distinctly have an energy content lying below a predetermined threshold value. The utilization of Fourier transform code systems to digitize speech or audio is well known in the state of the art and many examples of such systems appear in various publications.

According to one embodiment of the invention the semiconductor memory is accommodated on a support or in a casing or suitable housing which is sufficiently large to enable the handling thereof for the playback. In this manner, there is conceived a memory, as memory 10, or a plurality of such memory devices which essentially result in a Solid State Digital Disc ($=$SSDD $=S^2D^2$). The size of this system would be comparable to that of a compact disc.

As one can ascertain, ROM memory devices, such as 10, essentially constitutes semiconductor integrated circuit chips and are extremely small devices. Hence, a plurality of such devices can be accommodated in a very small volume, which volume would be comparable to the typical volume associated with a compact disc.

The output bus 15 of the memory 10 is coupled to the input of a digital-to-analog converter (D/A) 11 whose output in turn is coupled to the input of a typical analog audio amplifier 12. Such analog audio amplifiers may include typical integrated circuit chips which include operational amplifiers and are capable of responding to the analog output of the D/A converter 11 to produce at the output of amplifier 12 suitable audio signals. These audio signals are conventionally coupled to a speaker system 13. The speaker system 13 may be a suitable configuration which will include at least that number of speakers which is necessary for playback of stereo or other types of audio signals.

Figure 2:
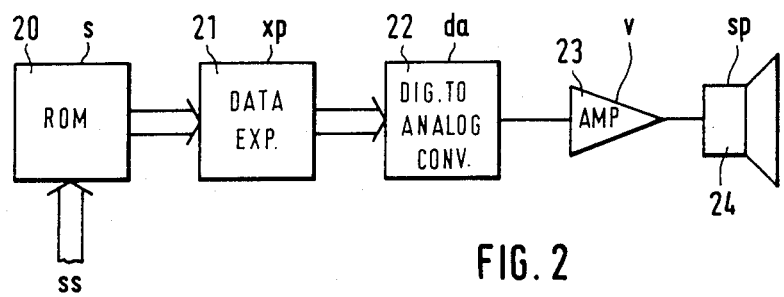
FIG. 2 shows a schematic block diagram of an additional embodiment of a playback device, as for example that shown in FIG. 1.

Referring to FIG. 2 there is shown an alternate embodiment of the invention. Again, a semiconductor memory or a plurality of memories 20 is employed to store, at various locations, different digitized audio signals. The output of the memory is coupled to a data expander module 21. The output of the data expander module is coupled to the input of the digital-to-analog converter 22 which provides, at its output, an analog signal which signal is coupled to the input of a typical audio amplifier 23 with the output of the audio amplifier coupled to a suitable speaker arrangement 24.

The data expander 21 is employed in instances where the audio signals, as stored in the memory, have been freed from redundancy. The data expander 21 is implemented by utilizing a digital signal processor which may include a microprocessor. The use of such digital signal processors serving as data expanders as 21 is well known and essentially such devices employ data reduction algorithms which can respond to the particular conditions of the various audio signals which have been stored in memory 20 during the storage procedure. In this manner, the specialized data reduction algorithm is also stored in memory 20. During playback the algorithm, as stored, is retrieved and essentially controls the microprocessor included in the data expander 21 to thereby control the expander program of the digital signal processor included in the data expander 21. It is well known that the data reduction is only required in connection with the reconditioning or processing of the stored audio signals. Hence, this is implemented only in the recording studio which therefore can include the necessary equipment to properly store signals in the ROM 20. In this manner, the data reduction algorithm can be optimized permitting the algorithms required for playback to be minimized so that there is optimum control of the data expander during the playback condition.

As one can also ascertain, the memory 20 of FIG. 2 can be partitioned so that different types of processed audio signals are stored in various forms. This permits different kinds of audio signals to be applied and to operate with different data reduction algorithms. These algorithms, as indicated, are also stored in memory and operate to control the microprocessor associated with the data expander 21. In such cases an identification is associated with each individual algorithm in the memory 20 and is capable of being called up in response to a corresponding stored audio signal which is outputted from memory. This then determines the expander algorithm associated with the data expander 21.

As one can ascertain, by the utilization of the memory 20, one can store not only digital audio signals but also store and program the data expander 21 via its microprocessor to thereby enable the optimum playback of audio signals. As indicated above, audio signals which have been processed according to different digital techniques may be stored in various memory locations and may be identified by suitable tags to enable the data expander 21 to operate on such signals in accordance with the tags and in accordance with various algorithms associated with the data as stored.

Figure 3:
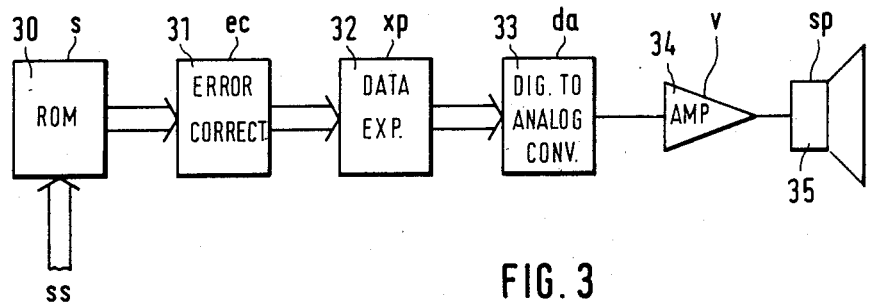
FIG. 3 shows a schematic block diagram of an alternate embodiment of playback device, as for example depicted in FIG. 2.

Referring to FIG. 3 there is shown still another embodiment of this invention. In regard to FIG. 3 there is again shown a ROM memory 30 which essentially stores a plurality of digitized audio signals at various memory locations. The output of the memory is coupled to an error correcting module 31. The error detecting and correcting algorithm associated with the module 31 is again stored in the memory 30. Furthermore, the extent of error correction may be adapted to operate with the above-described data reduction algorithm which, again, is associated with the data expander 32 and its associated microprocessor. Thus, as one can ascertain, error correctors such as 31, which are associated with digital signal processing, can have the algorithm stored in the ROM 30. In this manner the error corrector 31 will also contain a microprocessor which microprocessor is programmed directly from the data stored in memory 30. The microprocessor contained in the error corrector 31 is also associated with the microprocessor contained in the data expander 32 and, hence, the program stored in memory can operate to define the operating characteristics of both devices.

The output of the data expander 32 is again coupled to an input of a digital-to-analog converter 33 whose output is coupled to an audio amplifier 34 and then to an associated speaker system 35.

It is indicated that according to the above-described techniques it has been found that with a five-fold data reduction it is possible to obtain sound quality which is actually comparable to the quality of a compact disc. For example, for a one hour playback time there is required a storage capacity of approximately 1 gigabit. In regard to present semiconductor technology one still requires the use of several semiconductor memory chips which may be employed on a single board to implement the memory 30. In any event, as one can ascertain, many companies are already working on embodiments for combining such chips on one single semiconductor wafer to thereby provide large memory capacity in a single integrated circuit or utilizing a single integrated module containing a plurality of interconnected storage memories, such as ROM devices, on a single substrate.

Thus, as one can understand from the above-described embodiments, there is disclosed a system which is capable of storing digitized audio signals in a memory. These signals are thereafter retrieved and applied to the input of a conventional digital-to-analog converter which converts each of the digital signals back into an analog signal. The resultant analog signal is then amplified and applied to a conventional speaker system. The operation of memories in conjunction with digital-to-analog converters, as well as the necessary clocks for accessing memories and reading output data, are all well known in the prior art.

Thus, as one can see, the major aspect of the present invention utilizes a ROM memory for the storage of digitized audio signals such as music and so on. These signals can then be played back or reproduced without the need of any moving parts as, for example, moving heads or moving storage medium as those that exist in the prior art.

What is claimed is:

1. An audio playback apparatus for playback of stored audio signals without the use of mechanically moving playback means, comprising:

a read only memory having a plurality of storage locations, including at least one plurality of a large number of storage locations sufficient in capacity to permanently store at least one set of said audio signals in a digitized format corresponding to at least one continuous sound signal which is to be played back, a data reduction algorithm which is associated with each of said at least one set of audio signals which are stored in a digitized format, said each of at least one set of audio signals stored in a digitized format having a tag identifying the data reduction algorithm with which it is associated, and an error detecting and correcting algorithm which is associated with each of said at least one set of audio signals which are stored in a digitized format;

read out means for reading out at least one set of stored audio signals and tags associated therewith, said data reduction algorithm associated therewith, and said error detecting and correcting algorithm associated therewith from said at least one plurality of storage locations of said read only memory;

an error detecting and correcting means including a first programmable microprocessor for converting the output from the read out means into error corrected audio signals and correcting algorithm, said first programmable microprocessor having its control program stored in said read only memory;

a data expander means including a second programmable microprocessor for converting the output from said error detecting and correcting means into a digitized audio signal under control of said data reduction algorithm, said second programmable microprocessor having its control program stored in said read only memory, whereby said second programmable microprocessor selects said controlling data reduction algorithm according to the tag associated with said output from said error detecting and correcting means;

a digital-to-analog converter for converting said digitized audio signals output from said data expander into analog audio signals;

an analog audio amplifier having an input coupled to the output of said digital-to-analog converter for providing an output of amplified analog audio signals; and a loudspeaker system having an input coupled to the output of said amplifier for providing an audible sound signal from said amplifier analog audio signals.

2. The apparatus according to claim 1 wherein said read only memory is a semiconductor memory.

3. The apparatus according to claim 1 wherein said read only memory is a plurality of semiconductor memory chips coupled together to store said audio signals.

4. The apparatus according to claim 1 wherein said signals as stored are differential pulse code modulated signals which are free from redundancy.

5. The apparatus according to claim 1 wherein said signals as stored are transform coded signals which are free from redundancy.

* * * * *